(12) United States Patent  
Ker et al.

(10) Patent No.: US 7,092,227 B2
(45) Date of Patent: Aug. 15, 2006

(54) ELECTROSTATIC DISCHARGE PROTECTION CIRCUIT WITH ACTIVE DEVICE

(75) Inventors: Ming-Dou Ker, Hsinchu (TW); Tang-Kui Tseng, Hsinchu (TW); Hsin-Chin Jiang, Hsinchu (TW); Chyh-Yih Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 408 days.

(21) Appl. No.: 10/230,287

(22) Filed: Aug. 29, 2002

(65) Prior Publication Data

US 2004/0042143 A1 Mar. 4, 2004

(51) Int. Cl.
*H02H 9/00* (2006.01)
*H02H 3/22* (2006.01)
*H01L 27/01* (2006.01)

(52) U.S. Cl. .......................... 361/56; 361/111; 257/349
(58) Field of Classification Search ................ 361/56, 361/111; 257/349, 356, 408
See application file for complete search history.

(56) References Cited

U.S. PATENT DOCUMENTS

| | | | | |
|---|---|---|---|---|
| 4,692,781 A | * | 9/1987 | Rountree et al. ........... 257/360 |
| 5,400,202 A | * | 3/1995 | Metz et al. .................... 361/56 |
| 5,452,171 A | * | 9/1995 | Metz et al. .................... 361/56 |
| 5,510,279 A | * | 4/1996 | Chien et al. ................. 438/302 |
| 5,517,051 A | * | 5/1996 | Chatterjee .................... 257/360 |
| 5,572,394 A | * | 11/1996 | Ker et al. ..................... 361/56 |
| 5,631,793 A | | 5/1997 | Ker et al. |
| 5,646,808 A | * | 7/1997 | Nakayama ................... 361/56 |
| 5,734,541 A | * | 3/1998 | Iniewski et al. ............. 361/111 |
| 5,740,000 A | * | 4/1998 | Stackhouse et al. .......... 361/56 |
| 5,744,842 A | * | 4/1998 | Ker ............................. 257/362 |
| 5,747,834 A | * | 5/1998 | Chen et al. ................. 257/111 |
| 5,763,919 A | * | 6/1998 | Lin ............................. 257/360 |
| 5,838,146 A | * | 11/1998 | Singer ........................ 323/270 |
| 5,982,600 A | * | 11/1999 | Cheng ........................ 361/111 |
| 6,147,538 A | | 11/2000 | Andresen et al. |
| 6,426,291 B1 | * | 7/2002 | Hu et al. ..................... 438/682 |
| 6,671,153 B1 | * | 12/2003 | Ker et al. ................... 361/111 |

* cited by examiner

*Primary Examiner*—Brian Sircus
*Assistant Examiner*—James A. Demakis
(74) *Attorney, Agent, or Firm*—Finnegan, Henderson, Farabow, Garrett & Dunner, L.L.P.

(57) ABSTRACT

An electrostatic discharge protection circuit includes a first terminal, a second terminal, an electrostatic discharge device coupled between the first and second terminals, and an active device coupled to the electrostatic discharge device and controlling an electrostatic current through the electrostatic discharge device. The electrostatic discharge device includes at least one of an SCR, an FOD, an active device, a BJT, and an MOS device.

35 Claims, 17 Drawing Sheets

ELECTROSTATIC DISCHARGE PROTECTION CIRCUIT WITH ACTIVE DEVICE

RELATED APPLICATION

This application is related to U.S. patent application entitled "ELECTROSTATIC DISCHARGE PROTECTION DEVICE AND METHOD OF MANUFACTURING THE SAME," filed on Aug. 29, 2002, Ser. No. 10/230,255. This related application is expressly incorporated herein by reference.

FIELD OF THE INVENTION

This invention pertains in general to integrated circuits, and, more particularly, to electrostatic discharge protection circuits using an active device.

BACKGROUND

A semiconductor integrated circuit (IC) is generally susceptible to an electrostatic discharge (ESD) event, which may damage or destroy the IC. An ESD event refers to a phenomenon of electrical discharge of a current (positive or negative) for a short duration during which a large amount of current is provided to the IC. The high current may be built-up from a variety of sources, such as the human body. To protect an IC from an ESD event, traditional NMOS and PMOS devices are used to discharge an ESD current. However, traditional NMOS and PMOS devices may not respond quickly to an ESD event, and may require additional devices to facilitate triggering. Examples of known ESD protection schemes using additional devices to quickly conduct an ESD current are shown in FIGS. 1 and 2.

FIG. 1 is a reproduction of FIG. 2 of U.S. Pat. No. 5,631,793 (the '793 patent) to Ker, one of the inventors of the present invention. The '793 patent is entitled "Capacitor-Couple Electrostatic Discharge Protection Circuit" and describes an ESD protection circuit using a gate-couple technique in order to fast conduct an ESD current during an ESD event. To achieve the capacitor-couple effect, a resistor-capacitor circuit is coupled to the gates of MOS devices such that a portion of an ESD voltage can be coupled to the gates of the MOS devices, thereby raising the gate voltages and therefore lowering the snapback breakdown voltage of the device.

FIG. 2 is a reproduction of FIG. 3 of U.S. Pat. No. 6,147,538 (the '538 patent) to Andresen, entitled "CMOS Triggered NMOS ESD Protection Circuit". Andresen describes an ESD protection circuit using a substrate pumping technique. Pumping of a substrate, i.e., increasing substrate potential or applying a small positive bias voltage to the substrate, aids turn on of a parasitic transistor. Additional devices such as resistors and capacitors are also used in the '538 patent to achieve fast conduction of an ESD current.

A limitation with the '793 patent and the '538 patent is that the additional devices, e.g., capacitors and resistors, are passive. Such passive devices require large area for fabrication and complicate making protection circuits.

SUMMARY OF THE INVENTION

Accordingly, the present invention is directed to ESD protection circuits that obviate one or more of the problems due to limitations and disadvantages of the related art. The ESD protection circuit of the present invention includes an "active device" for fast conducting an ESD protection device in the circuit. As used herein, the "active device" refers to an electrostatic discharge protection device as claimed in U.S. Pat. No. 6,882,009 comprising a p-type substrate (or n-type substrate for a p-type active device), an n-type source region, an n-type drain region, a gate, and a lightly doped p-type region formed between the source and drain regions and under the gate. The active device is a low threshold voltage device, including a zero threshold voltage or negative threshold voltage device, and has the advantages of fast response to an ESD event and strong ESD robustness. Further details about the active device are discussed in co-pending U.S. patent application to Ker et al, Ser. No. 10/230,055 now U.S. Pat. No. 6,882,009, entitled 'ELECTROSTATIC DISCHARGE PROTECTION DEVICE AND METHOD OF MANUFACTURING THE SAME", filed Aug. 29, 2002, and assigned to the common assignee of the present application, the entire specification of which is incorporated herein by reference for all purposes.

Additional features and advantages of the invention will be set forth in the description which follows, and in part will be apparent from the description, or may be learned by practice of the invention. The objectives and other advantages of the invention will be realized and attained by the circuit structures particularly pointed out in the written description and claims thereof, as well as the appended drawings.

To achieve these and other advantages, and in accordance with the purpose of the invention as embodied and broadly described, there is provided an electrostatic discharge protection circuit that includes a first terminal, a second terminal, an electrostatic discharge device coupled between the first and second terminals, and an active device coupled to the electrostatic discharge device, the active device to control an electrostatic current through the electrostatic discharge device.

In one aspect of the present invention, the electrostatic discharge device includes at least one of an SCR, an FOD, an active device, a BJT, and an MOS device.

In another aspect of the present invention, the active device includes an n-type active device or a p-type active device.

Also in accordance with the present invention, there is provided an integrated circuit that includes at least one electrostatic current path, and a plurality of electrostatic discharge protection circuits on the current path, each electrostatic discharge protection circuit comprising a first terminal, a second terminal, an electrostatic discharge device coupled between the first and second terminals, and an active device coupled to the electrostatic discharge device, the active device to control an electrostatic current through the electrostatic discharge device.

In one aspect of the present invention, the electrostatic discharge device includes at least one of an SCR, an FOD, an active device, a BJT, and an MOS device.

In another aspect of the present invention, the active device includes an n-type active device or a p-type active device.

Further in accordance with the present invention, there is provided a method for electrostatic discharge protection circuit. The method includes turning on an active device to allow an electrostatic discharge current to flow through an electrostatic discharge device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings,

FIG. 5A shows a circuit diagram of an ESD protection circuit in accordance with one embodiment of the present invention including an n-type active device and an SCR;

FIG. 5B shows a circuit diagram of an ESD protection circuit in accordance with one embodiment of the present invention including a p-type active device and an SCR;

FIG. 9A shows a circuit diagram of an ESD protection circuit in accordance with one embodiment of the present invention including an n-type active device and a field oxide device of a type having a lateral n-p-n BJT;

FIG. 9B shows a circuit diagram of an ESD protection circuit in accordance with one embodiment of the present invention including a p-type active device and a field oxide device of a type having a lateral n-p-n BJT;

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
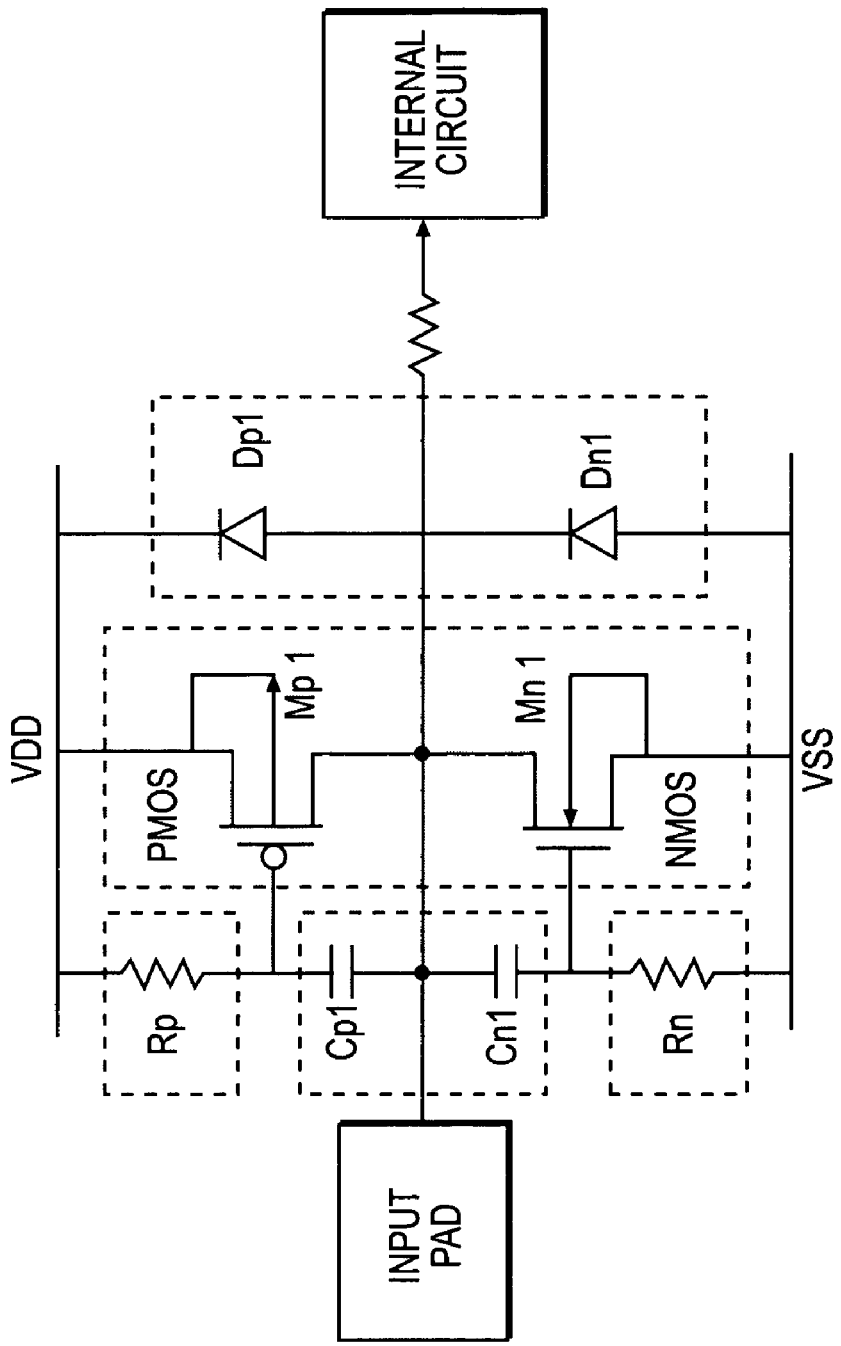
FIG. 1 shows a prior electrostatic discharge protection circuit.
Figure 2:
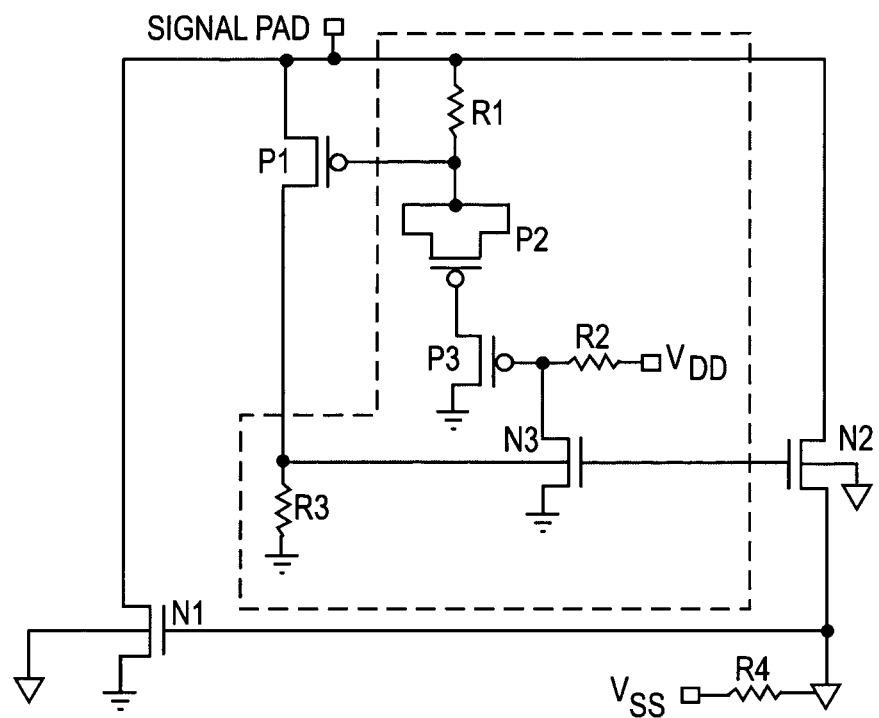
FIG. 2 shows another prior electrostatic discharge protection circuit.
Figure 3A:
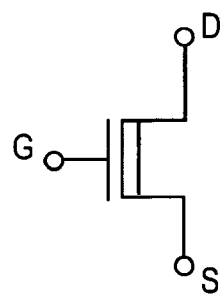
FIG. 3A shows the circuit symbol of an n-type active device consistent with the invention.
Figure 3B:
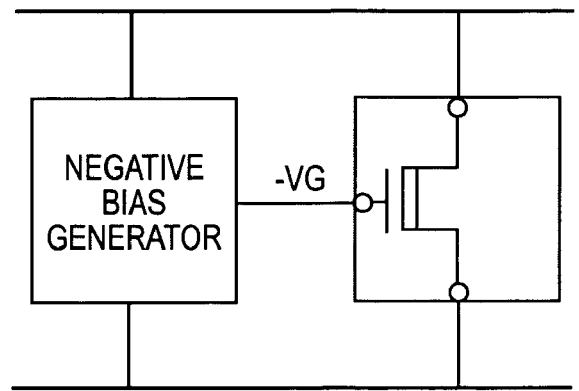
FIG. 3B shows a schematic view of an n-type active device with its gate coupled to a negative bias generator.
Figure 4A:
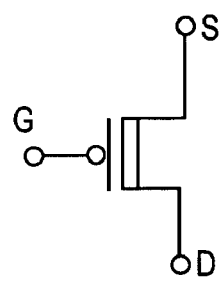
FIG. 4A shows the circuit symbol of a p-type active device consistent with the invention.
Figure 4B:
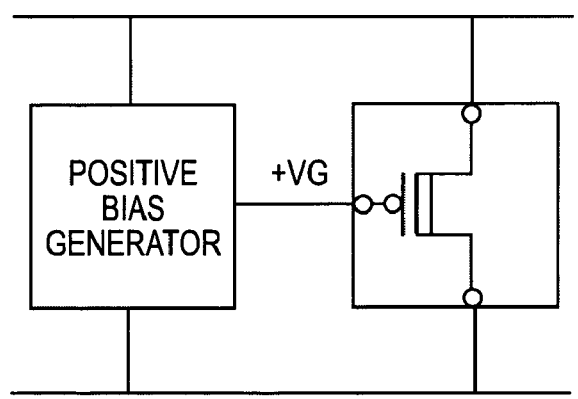
FIG. 4B shows a schematic view of a p-type active device with its gate coupled to a positive bias generator.

FIGS. 3A and 4A show the circuit symbols of an n-type active device and a p-type active device, respectively, which are used in the embodiments described below. An n-type active device is formed in a p-type substrate and includes a gate (G), a pair of diffused regions including a source (S) and a drain (D) of n-type dopant, and a lightly doped p-type region formed between the source and drain and under the gate. A p-type active device is formed in a similar manner as the n-type active device by using opposite dopants. The lightly doped regions formed in the active devices contribute to the ideal properties such as low threshold voltage, including a zero or negative threshold voltage, strong ESD robustness and fast conduction during an ESD event. The active devices in the following embodiments are based on the active devices described in the related application noted above. Since an active device may have a leakage current under normal operation, it is advantageous to couple a gate of an n-type active device to a negative bias generator, and a gate of a p-type active device to a positive bias generator, as respectively shown in FIGS. 3B and 4B.

The following embodiments disclose ESD protection circuits that integrate an active device and known ESD robust devices such as, for example, an SCR (silicon controlled rectifier), a BJT (bipolar junction transistor), an FOD (field oxide device) or a MOS (metal oxide semiconductor) device. By integrating an active device with a known ESD device, the following embodiments provide the advantages of fast ESD conduction and ESD robustness.

Figure 5C:
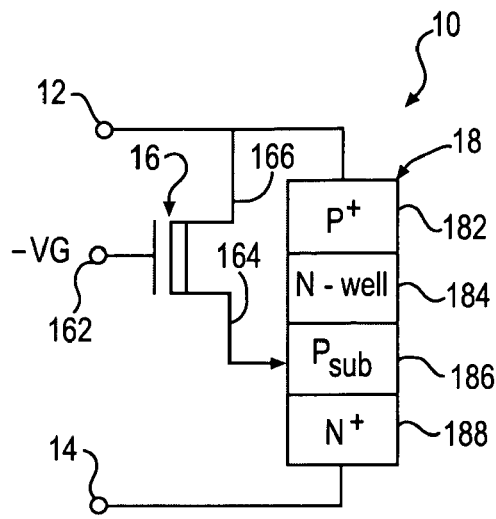
FIG. 5C shows a cross-sectional view of the ESD protection circuit shown in FIG. 5A.
Figure 5C:
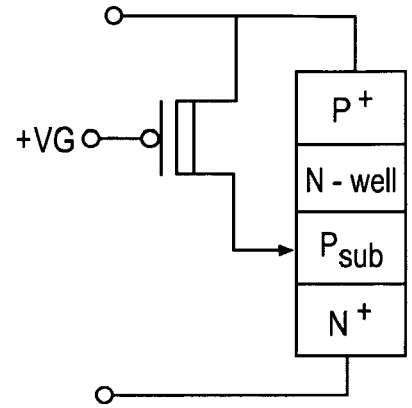
Figure 5C:
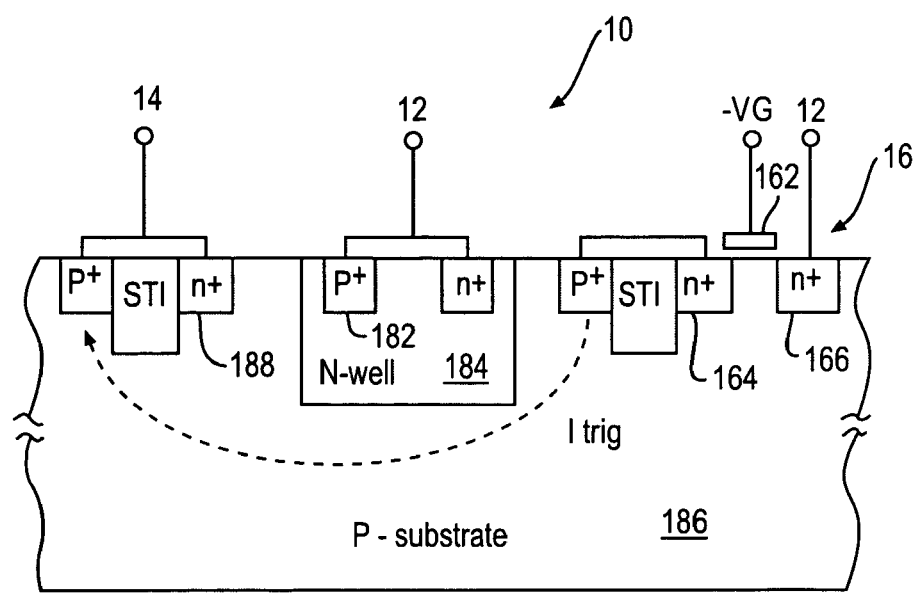

FIGS. 5A to 5C show a circuit diagram of an ESD protection circuit in accordance with one embodiment of the present invention. Referring to FIG. 5A, an ESD protection circuit 10 includes an n-type active device 16 and an SCR 18 coupled between a first terminal 12 and a second terminal 14. First terminal 12 and second terminal 14 may be an I/O pad or a power line (not shown). SCR 18 includes a first p-type portion 182, a first n-type portion 184, a second p-type portion 186, and a second n-type portion 188. First n-type portion 184 and second p-type portion 186 serve as a base for a p-n-p BJT and a base for an n-p-n BJT formed in SCR 18, respectively. N-type active device 16 includes a gate 162 coupled to a negative bias source $-V_G$, a drain 166 coupled to first terminal 12, and a source 164 coupled to second p-type portion 186 of SCR 18.

FIG. 5B shows a circuit diagram of an ESD protection circuit (not numbered) the same as the ESD protection circuit 10 shown in FIG. 5A except that, for example, a p-type active device (not numbered) is used instead of an n-type active device and a gate (not numbered) of the p-type active device is coupled to a positive bias source $+V_G$.

Referring to FIG. 5C, a cross-sectional view of ESD protection circuit 10 shown in FIG. 5A is illustrated. First p-type region 182 and first n-type region 184 are coupled to first terminal 12, and second p-type region 186 and second n-type region 188 are coupled to second terminal 14. In operation, in response to a positive ESD pulse occurring at first terminal 12, drain 166 of n-type active device 16 generates a trigger current $I_{trig}$ to pump substrate 186 so as to quickly turn on SCR 18, thereby allowing SCR 18 to conduct an ESD current more faster than an SCR operating without an active device. Therefore, ESD protection circuit 10, by integrating n-type active device 16 having the property of low threshold voltage, and SCR 18 having the property of ESD robustness, achieves the both advantages of fast turn on and ESD robustness.

In the following embodiments, although ESD protection circuits based on n-type or p-type active devices are illustrated, only the n-type circuits are described. Persons skilled in the art will understand that ESD protection circuits including p-type active devices operate in a similar manner to those including n-type active devices.

Figure 6A:
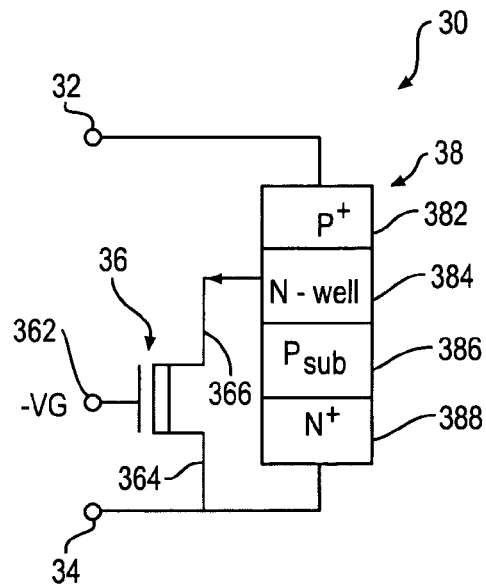
FIG. 6A shows a circuit diagram of an ESD protection circuit in accordance with another embodiment of the present invention including an n-type active device and an SCR.
Figure 6B:
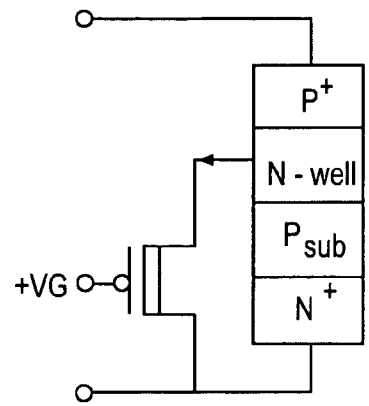
FIG. 6B shows a circuit diagram of an ESD protection circuit in accordance with another embodiment of the present invention including a p-type active device and an SCR.

FIGS. 6A and 6B show a circuit diagram of an ESD protection circuit in accordance with another embodiment of the present invention. Referring to FIG. 6A, an ESD protection circuit 30 includes an n-type active device 36 and an SCR 38 coupled between a first terminal 32 and a second terminal 34. SCR 38 includes a first p-type portion 382, a first n-type portion 384, a second p-type portion 386, and a second n-type portion 388. First n-type portion 384 and second p-type portion 386 serve as a base for a p-n-p BJT and a base for an n-p-n BJT in SCR 38, respectively. N-type active device 36 includes a gate 362 coupled to a negative bias source $-V_G$, a drain 366 coupled to first n-type portion 384, and a source 364 coupled to second terminal 34.

In operation, in response to a negative ESD pulse occurring at second terminal 34, n-type active device 36 turns on to lower the potential of N-well 384 so as to quickly turn on SCR 38.

FIG. 6B shows a circuit diagram of an ESD protection circuit (not numbered) the same as the ESD protection circuit 30 shown in FIG. 6A except that, for example, a p-type active device (not numbered) is used instead of an n-type active device and a gate (not numbered) of the p-type active device is coupled to a positive bias $+V_G$.

Figure 7A:
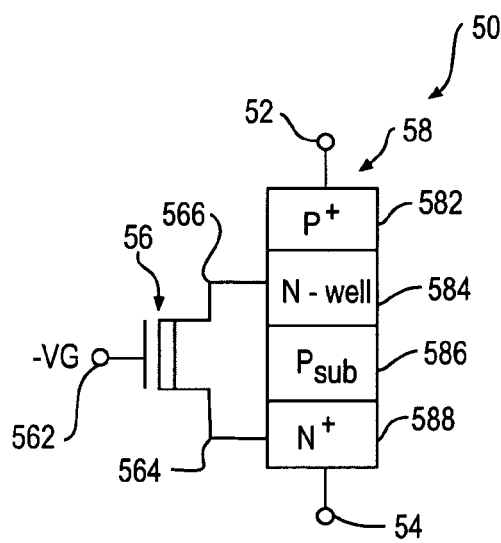
FIG. 7A shows a circuit diagram of an ESD protection circuit in accordance with still another embodiment of the present invention including an n-type active device and an SCR.
Figure 7B:
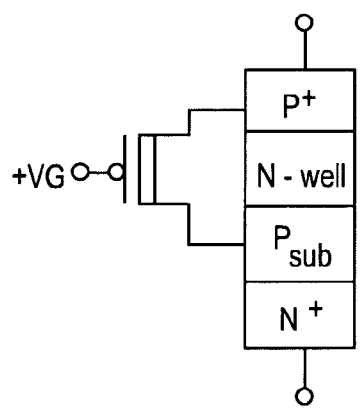
FIG. 7B shows a circuit diagram of an ESD protection circuit in accordance with still another embodiment of the present invention including a p-type active device and an SCR.

FIGS. 7A and 7B show a circuit diagram of an ESD protection circuit, in which an LVTSCR (low voltage triggered SCR) structure is formed by incorporating an active device within an SCR. Referring to FIG. 7A, an ESD protection circuit 50 includes an n-type active device 56 and an SCR 58 which is coupled between a first terminal 52 and a second terminal 54. SCR 58 includes a first p-type portion 582, a first n-type portion 584, a second p-type portion 586, and a second n-type portion 588. First n-type portion 584 and second p-type portion 586 serve as a base for a p-n-p BJT and a base for an n-p-n BJT in SCR 58, respectively. N-type active device 56 includes a gate 562 coupled to a negative bias source $-V_G$, a drain 566 coupled to first n-type portion 584, and a source 564 coupled to second n-type portion 588. Although not illustrated, persons skilled in the art will recognize that in the n-type LVTSCR structure, source 564 of n-type active device 56 serves as second n-type portion 588 of SCR 58, and drain 566 of n-type active device 56 is partially formed within first n-type portion 584 of SCR 58.

In operation, in response to a negative ESD pulse occurring at second terminal 54, drain 566 of active device 56 generates a trigger current (not shown) to pump substrate 586 so as to quickly turn on SCR 58, thereby allowing SCR 58 to conduct an ESD current.

FIG. 7B shows a circuit diagram of an ESD protection circuit (not numbered) the same as the ESD protection circuit 50 shown in FIG. 7A except that, for example, a p-type active device (not numbered) is used instead of an n-type active device and a gate (not numbered) of the p-type active device is coupled to a positive bias $+V_G$. In the p-type LVTSCR structure, a drain of the p-type active device serves as a first p-type portion of an SCR (not numbered), a source of the p-type active device is partially formed within a second p-type portion of the SCR.

Figure 8A:
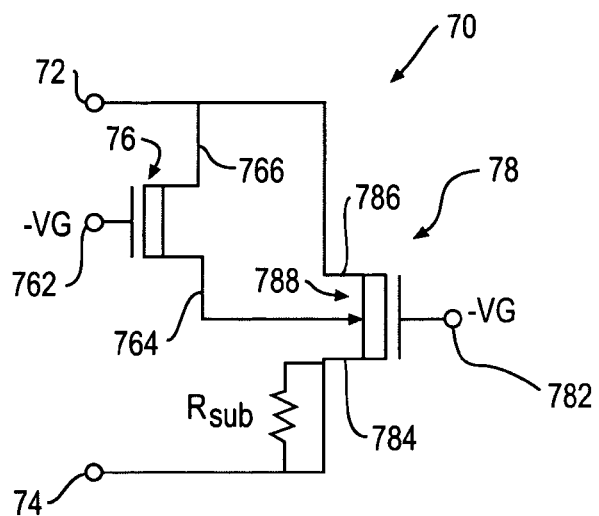
FIG. 8A shows a circuit diagram of an ESD protection circuit in accordance with one embodiment of the present invention including a first n-type active device and a second n-type active device.
Figure 8B:
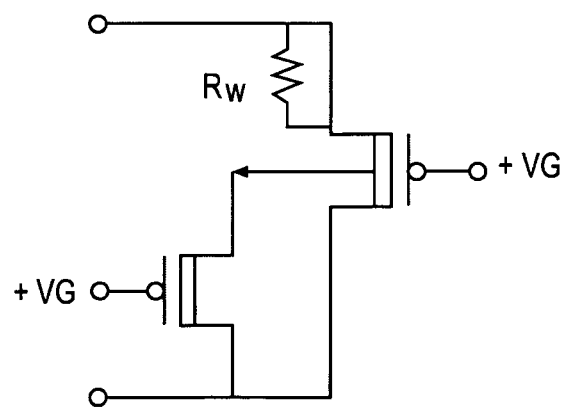
FIG. 8B shows a circuit diagram of an ESD protection circuit in accordance with one embodiment of the present invention including a first p-type active device and a second p-type active device.

FIGS. 8A and 8B show a circuit diagram of an ESD protection circuit using a first active device to trigger a second active device. Referring to FIG. 8A, an ESD protection circuit 70 includes a first n-type active device 76 and a second n-type active device 78 which is coupled between a first terminal 72 and a second terminal 74. Second n-type active device 78 includes a gate 782 coupled to a negative bias source $-V_G$, a drain 786 coupled to first terminal 72, a source 784 coupled to second terminal 74, and a base 788. First n-type active device 76 includes a gate coupled to a negative bias source $-V_G$, a drain 766 coupled to first terminal 72, and a source 764 coupled to base 788 of second n-type active device 78.

In operation, in response to a positive ESD pulse occurring at first terminal 72, drain 766 of first active device 76 generates a trigger current (not shown) to pump base 788 of second active device 78 so as to quickly turn on second active device 78, thereby allowing second active device 78 to conduct an ESD current. Besides, a substrate resistor $R_{sub}$ is formed between source 784 and second terminal 74 to absorb a portion of the ESD current.

FIG. 8B shows a circuit diagram of an ESD protection circuit (not numbered) the same as the ESD protection circuit 70 shown in FIG. 8A except that, for example, a p-type active device (not numbered) is used to trigger another p-type active device, gates (not numbered) of the p-type active devices are coupled to a positive bias source $+V_G$, and a well resistor $R_w$ is formed to absorb a portion of an ESD current.

Figure 9C:
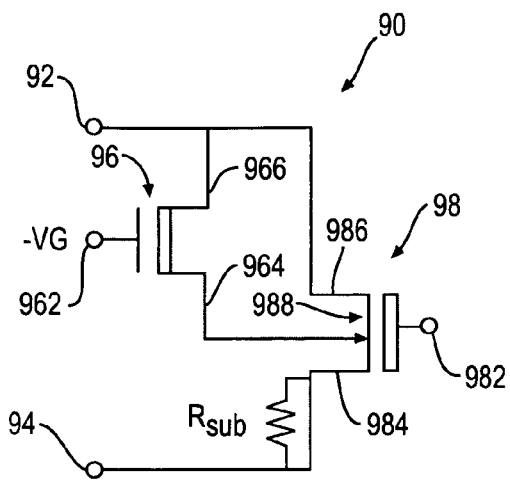
FIG. 9C shows a cross-sectional view of the ESD protection circuit shown in FIG. 9A.
Figure 9C:
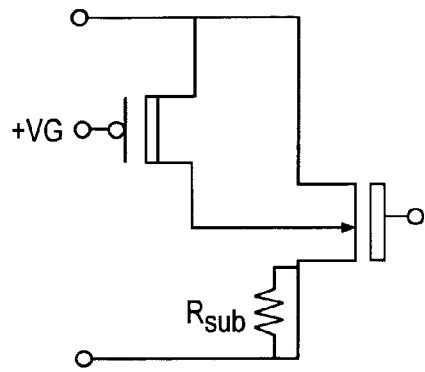
Figure 9C:
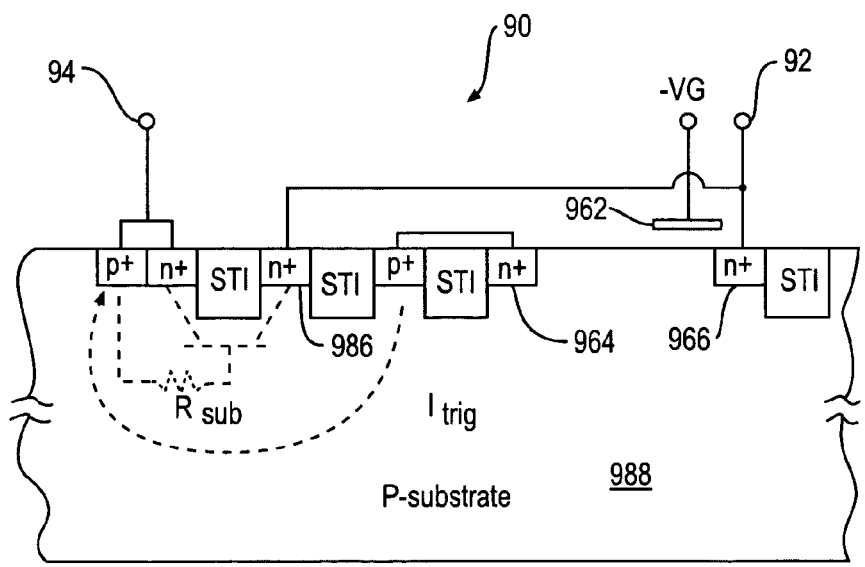

FIGS. 9A to 9C show a circuit diagram of an ESD protection circuit using an active device to trigger a field oxide device (FOD) including a lateral n-p-n BJT. Referring to FIG. 9A, an ESD protection circuit 90 includes an n-type active device 96 and an FOD 98 which is coupled between a first terminal 92 and a second terminal 94. FOD 98 includes a gate 982 which is a dielectric layer clad with metal, a drain 986 of n-type dopant coupled to first terminal 92, a source 984 of n-type dopant coupled to second terminal 94, and a base 988 of p-type dopant. N-type active device 96 includes a gate 962 coupled to a negative bias source $-V_G$, a drain 966 coupled to first terminal 92, and a source 964 coupled to base 988 of FOD 98. A substrate resistor $R_{sub}$ is formed between source 984 of FOD 982 and second terminal 94 to absorb a portion of an ESD current.

FIG. 9B shows a circuit diagram of an ESD protection circuit (not numbered) the same as the ESD protection circuit 90 shown in FIG. 9A except that, for example, a p-type active device (not numbered) is used instead of an n-type active device and a gate (not numbered) of the p-type active device is coupled to a positive bias $+V_G$.

FIG. 9C shows a cross-sectional view of the ESD protection circuit 90 shown in FIG. 9A. Referring to FIG. 9C, a lateral parasitic n-p-n BJT (shown by dotted line) is formed in which n-type region 986, n-type region 984, and substrate 988 serve as the collector, emitter and base of the lateral parasitic n-p-n BJT, respectively. In operation, in response to a positive ESD pulse occurring at first terminal 92, drain 966 of n-type active device 96 generates a trigger current $I_{trig}$ to pump base 988 of FOD 98 so as to quickly turn on FOD 98, thereby allowing FOD 98 to conduct an ESD current.

Figure 10A:
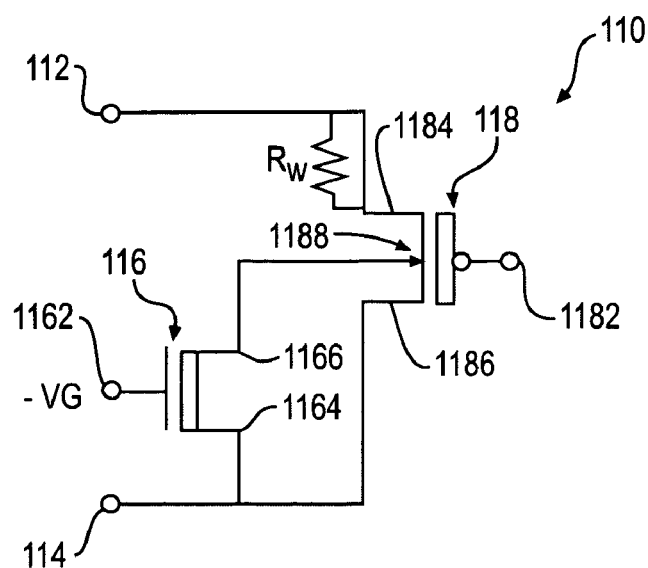
FIG. 10A shows a circuit diagram of an ESD protection circuit in accordance with one embodiment of the present invention including an n-type active device and a field oxide device of a type having a lateral p-n-p BJT.
Figure 10B:
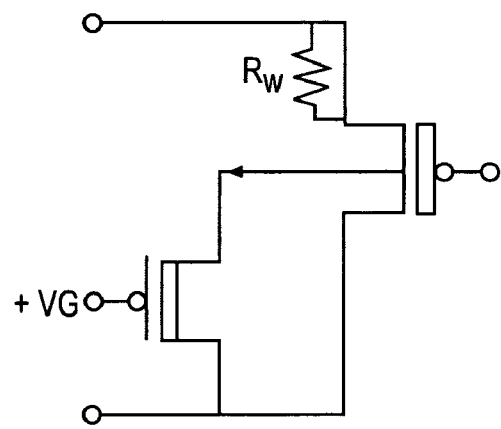
FIG. 10B shows a circuit diagram of an ESD protection circuit in accordance with one embodiment of the present invention including a p-type active device and a field oxide device of a type having a lateral p-n-p BJT.

FIGS. 10A and 10B show a circuit diagram of an ESD protection circuit using an active device to trigger an FOD including a lateral p-n-p BJT. Referring to FIG. 10A, an ESD protection circuit 110 includes an n-type active device 116 and an FOD 118 which is coupled between a first terminal 112 and a second terminal 114. FOD 118 includes a gate 1182, which is a dielectric layer clad with metal, a drain 1186 of p-type dopant coupled to second terminal 114, a source 1184 of p-type dopant coupled to first terminal 112, and a base 1188 of n-type dopant. N-type active device 116 includes a gate 1162 coupled to a negative bias source $-V_G$, a source 1164 coupled to second terminal 114, and a drain 1166 coupled to base 1188 of FOD 118. A well resistor $R_w$ is formed between source 1184 of FOD 118 and first terminal 112 to absorb a portion of an ESD current.

In operation, in response to a negative ESD pulse occurring at second terminal 114, drain 1166 of n-type active device 116 generates a trigger current (not shown) to pump base 1188 of FOD 118 so as to quickly turn on FOD 118, thereby allowing FOD 118 to conduct an ESD current.

FIG. 10B shows a circuit diagram of an ESD protection circuit (not numbered) the same as the ESD protection circuit 110 shown in FIG. 10A except that, for example, a p-type active device (not numbered) is used instead of an n-type active device and a gate (not numbered) of the p-type active device is coupled to a positive bias $+V_G$.

Figure 11A:
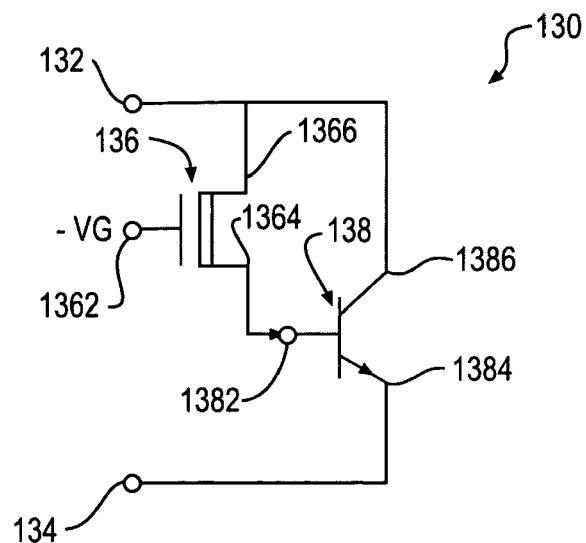
FIG. 11A shows a circuit diagram of an ESD protection circuit in accordance embodiment of the present invention including an n-type active device and an n-p-n BJT.
Figure 11B:
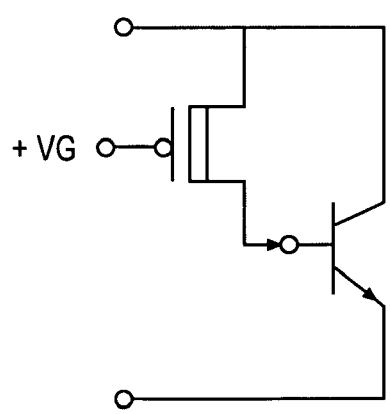
FIG. 11B shows a circuit diagram of an ESD protection circuit in accordance with one embodiment of the present invention including a p-type active device and an n-p-n BJT.

FIGS. 11A and 11B show a circuit diagram of an ESD protection circuit using an active device to trigger an n-p-n BJT. Referring to FIG. 11A, an ESD protection circuit 130 includes an n-type active device 136 and an n-p-n BJT 138 which is coupled between a first terminal 132 and a second terminal 134. The n-p-n BJT 138 includes a base 1382, a collector 1386 coupled to first terminal 132, and an emitter 1384 coupled to second terminal 134. N-type active device 136 includes a gate 1362 coupled to a negative bias source $-V_G$, a drain 1366 coupled to first terminal 132, and a source 1364 coupled to base 1382 of n-p-n BJT 138.

In operation, in response to a positive ESD pulse occurring at first terminal 132, drain 1366 of n-type active device 136 generates a trigger current (not shown) to pump base 1382 of n-p-n BJT 138 so as to quickly turn on n-p-n BJT 138, thereby allowing n-p-n BJT 138 to conduct an ESD current.

FIG. 11B shows a circuit diagram of an ESD protection circuit (not numbered) the same as the ESD protection circuit 130 shown in FIG. 11A except that, for example, a p-type active device (not numbered) is used instead of an n-type active device and a gate (not numbered) of the p-type active device is coupled to a positive bias $+V_G$.

Figure 12A:
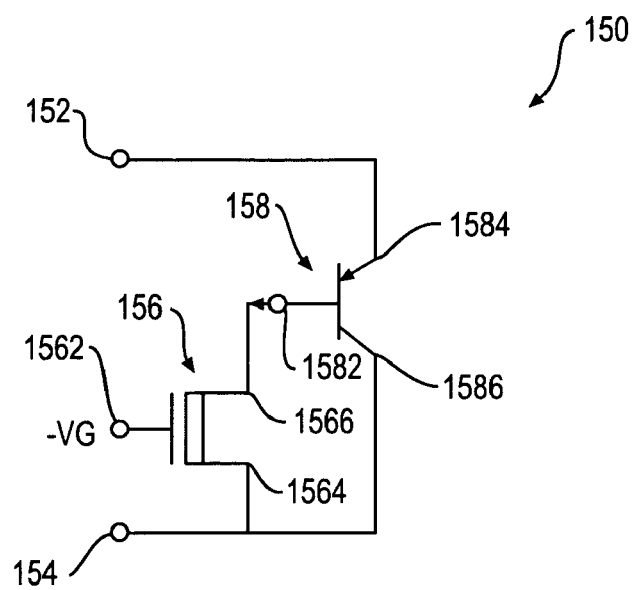
FIG. 12A shows a circuit diagram of an ESD protection circuit in accordance with one embodiment of the present invention including an n-type active device and a p-n-p BJT.
Figure 12B:
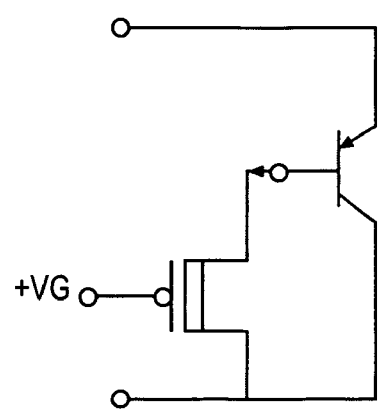
FIG. 12B shows a circuit diagram of an ESD protection circuit in accordance with one embodiment of the present invention including a p-type active device and a p-n-p BJT.

FIGS. 12A and 12B show a circuit diagram of an ESD protection circuit using an active device to trigger a p-n-p BJT. Referring to FIG. 12A, an ESD protection circuit 150 includes an n-type active device 156 and an p-n-p BJT 158 which is coupled between a first terminal 152 and a second terminal 154. The p-n-p BJT 158 includes a base 1582, a collector 1586 coupled to second terminal 154, and an emitter 1584 coupled to first terminal 152. N-type active device 156 includes a gate 1562 coupled to a negative bias source $-V_G$, a source 1564 coupled to second terminal 154, and a drain 1566 coupled to base 1582 of p-n-p BJT 158.

In operation, in response to a negative ESD pulse occurring at second terminal 154, drain 1566 of n-type active device 156 generates a trigger current (not shown) to pump base 1582 of p-n-p BJT 158 so as to quickly turn on p-n-p BJT 158, thereby allowing p-n-p BJT 158 to conduct an ESD current.

FIG. 12B shows a circuit diagram of an ESD protection circuit (not numbered) the same as the ESD protection circuit 150 shown in FIG. 12A except that, for example, a p-type active device (not numbered) is used instead of an n-type active device and a gate (not numbered) of the p-type active device is coupled to a positive bias source $+V_G$.

Figure 13A:
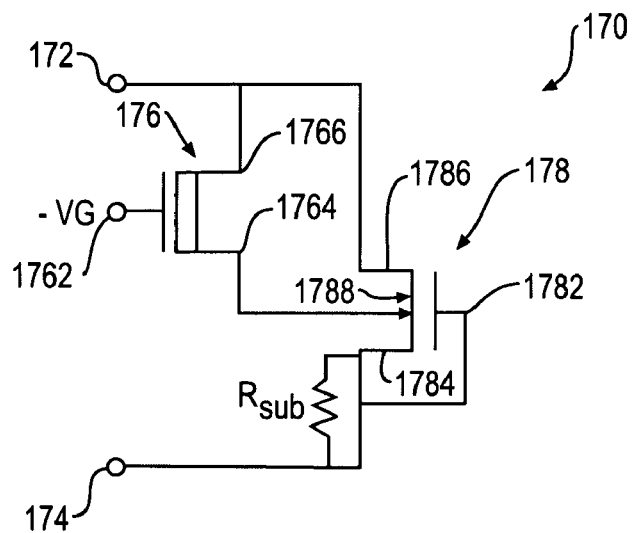
FIG. 13A shows a circuit diagram of an ESD protection circuit in accordance with one embodiment of the present invention including an n-type active device and an NMOS device.
Figure 13B:
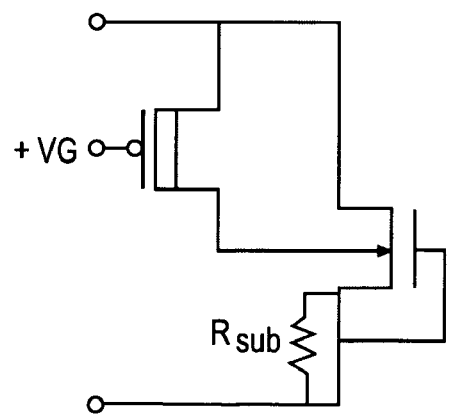
FIG. 13B shows a circuit diagram of an ESD protection circuit in accordance with one embodiment of the present invention including a p-type active device and an NMOS device.

FIGS. 13A and 13B show a circuit diagram of an ESD protection circuit using an active device to trigger an NMOS device. Referring to FIG. 13A, an ESD protection circuit 170 includes an n-type active device 176 and an NMOS 178 which is coupled between a first terminal 172 and a second terminal 174. NMOS 178 includes a drain 1786 coupled to first terminal 172, a source 1784 coupled to second terminal 174, a gate 1782 coupled to source 1784, and a base 1788.

N-type active device 176 includes a gate 1762 coupled to a negative bias source $-V_G$, a drain 1766 coupled to first terminal 172, and a source 1764 coupled to base 1788 of NMOS 178. A substrate resistor $R_{sub}$ is formed between source 1784 of NMOS 178 and second terminal 174 to absorb a portion of an ESD current.

In operation, in response to a positive ESD pulse occurring at first terminal 172, drain 1766 of n-type active device 176 generates a trigger current to pump base 1788 of NMOS 178 so as to quickly turn on NMOS 178, thereby allowing NMOS 178 to conduct an ESD current.

FIG. 13B shows a circuit diagram of an ESD protection circuit (not numbered) the same as the ESD protection circuit 170 shown in FIG. 13A except that, for example, a p-type active device (not numbered) is used instead of an n-type active device and a gate (not numbered) of the p-type active device is coupled to a positive bias source $+V_G$.

Figure 14A:
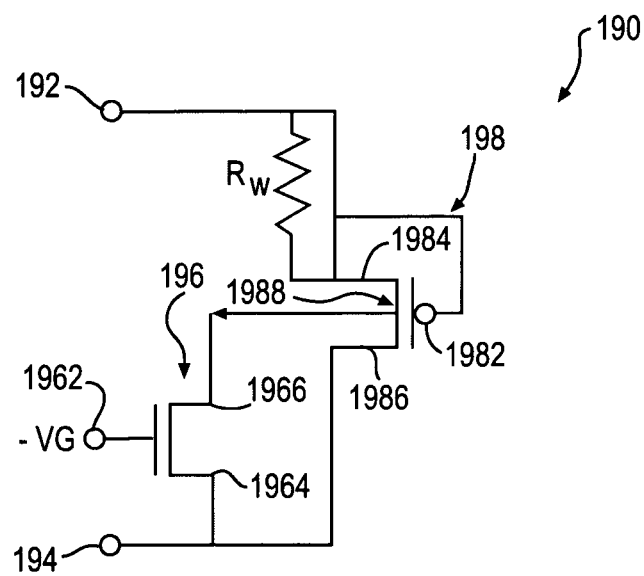
FIG. 14A shows a circuit diagram of an ESD protection circuit in accordance with the invention including an n-type active device and a PMOS device.
Figure 14B:
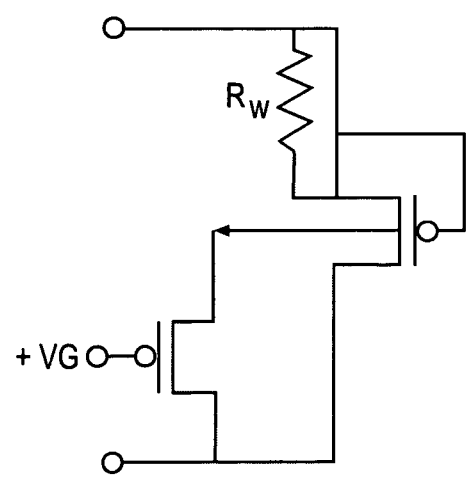
FIG. 14B shows a circuit diagram of an ESD protection circuit in accordance with the invention including a p-type active device and a PMOS device.

FIGS. 14A and 14B show a circuit diagram of an ESD protection circuit using an active device to trigger a PMOS device. Referring to FIG. 14A, an ESD protection circuit 190 includes an n-type active device 196 and a PMOS 198 which is coupled between a first terminal 192 and a second terminal 194. PMOS 198 includes a source 1984 coupled to first terminal 192, a drain 1986 coupled to second terminal 194, a gate 1982 coupled to source 1984, and a base 1988. N-type active device 196 includes a gate 1962 coupled to a negative bias source $-V_G$, a source 1964 coupled to second terminal 194, and a drain 1966 coupled to base 1988 of PMOS 198. A well resistor $R_w$ is formed between source 1984 of PMOS 198 and first terminal 192 to absorb a portion of an ESD current.

In operation, in response to a negative ESD pulse occurring at second terminal 194, drain 1966 of n-type active device 196 generates a trigger current (not shown) to pump base 1988 of PMOS 198 so as to quickly turn on PMOS 198, thereby allowing PMOS device 198 to conduct an ESD current.

FIG. 14B shows a circuit diagram of an ESD protection circuit (not numbered) the same as the ESD protection circuit 190 shown in FIG. 14A except that, for example, a p-type active device (not numbered) is used instead of an n-type active device and a gate (not numbered) of the p-type active device is coupled to a positive bias source $+V_G$.

Figure 15A:
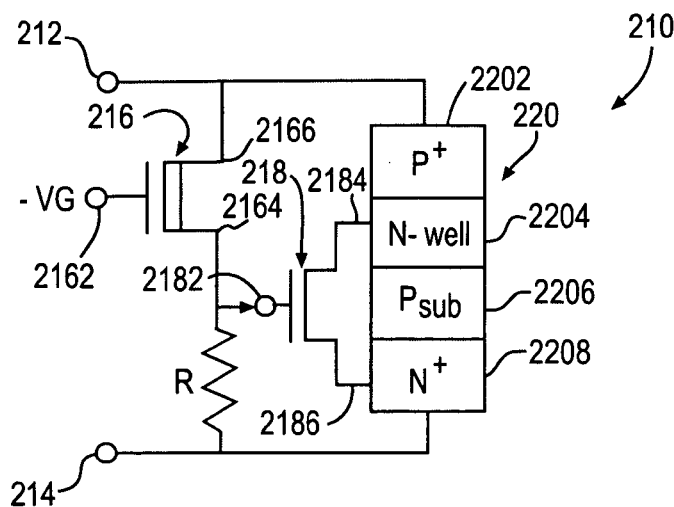
FIG. 15A shows a circuit diagram of an ESD protection circuit in accordance with one embodiment of the present invention including an n-type active device, an NMOS, and an SCR.
Figure 15B:
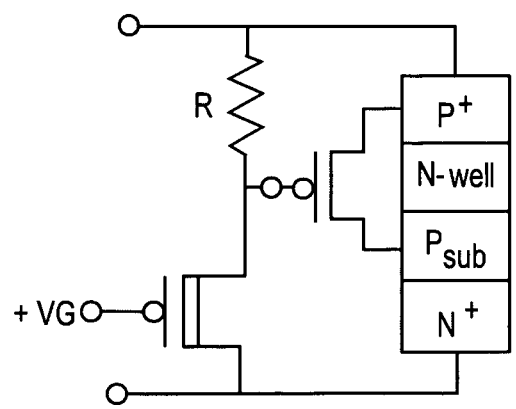
FIG. 15B shows a circuit diagram of an ESD protection circuit in accordance with one embodiment of the present invention including a p-type active device, a PMOS, and an SCR.

FIGS. 15A and 15B show a circuit diagram of an ESD protection circuit using an active device to trigger an LVTSCR including a MOS device and an SCR. Referring to FIG. 15A, an ESD protection circuit 210 includes an n-type active device 216 and an LVTSCR including an NMOS 218 and an SCR 220. SCR 220 is coupled between a first terminal 212 and a second terminal 214, and has a first p-type region 2202, a first n-type region 2204, a second p-type region 2206, and a second n-type region 2208. NMOS 218 has a gate 2182, a drain 2184 coupled within first n-type region 2204 of SCR 220, and a source 2186 coupled within second n-type region 2208 of SCR 220. N-type active device 216 includes a gate 2162 coupled to a negative bias source $-V_G$, a drain 2166 coupled to first terminal 212, and a source 2164 coupled to gate 2182 of NMOS 218. A resistor R is connected between source 2164 of n-type active device 216 and second terminal 214 to generate a positive voltage during an ESD event.

In operation, in response to a positive ESD pulse occurring at first terminal 212, n-type active device 216 triggers gate 2182 of NMOS 218 which in turn triggers SCR 220 so as to conduct an ESD current.

FIG. 15B shows a circuit diagram of an ESD protection circuit (not numbered) the same as the ESD protection circuit 210 shown in FIG. 15A except that, for example, a p-type active device (not numbered) is used to trigger a PMOS (not numbered), a gate (not numbered) of the p-type active device is coupled to a positive bias source $+V_G$, and a source and a drain (not numbered) of the PMOS are coupled within a first and a second p-type region (not numbered) of an SCR (not numbered), respectively.

Figure 16A:
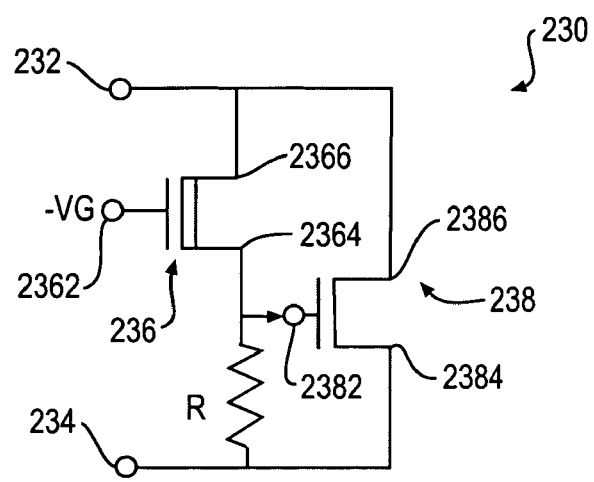
FIG. 16A shows a circuit diagram of an ESD protection circuit in accordance with one embodiment of the present invention including an n-type active device and an NMOS device.
Figure 16B:
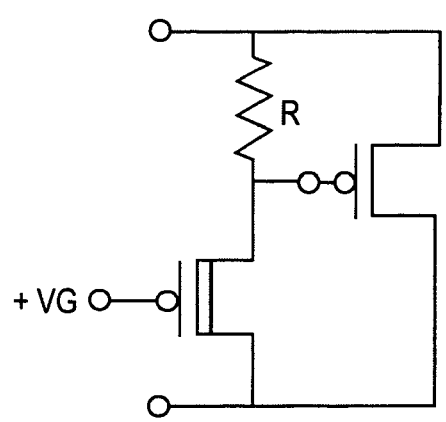
FIG. 16B shows a circuit diagram of an ESD protection circuit in accordance with one embodiment of the present invention including a p-type active device and a PMOS device.

FIGS. 16A and 16B show a circuit diagram of an ESD protection circuit using an active device to trigger an NMOS device. Referring to FIG. 16A, an ESD protection circuit 230 includes an n-type active device 236 and an NMOS 238 which is coupled between a first terminal 232 and a second terminal 234. NMOS 238 includes a gate 2382, a drain 2386 coupled to first terminal 232, and a source 2384 coupled to second terminal 234. N-type active device 236 includes a gate 2362 coupled to a negative bias source $-V_G$, a drain 2366 coupled to first terminal 232, and a source 2364 coupled to gate 2382 of NMOS 238. A resistor R is connected between source 2364 of n-type active device 236 and second terminal 234 to generate a positive voltage across gate 2382 of NMOS 238 and second terminal 234 during an ESD event.

In operation, in response to a positive ESD pulse occurring at first terminal 232, n-type active device 236 triggers NMOS 238 to quickly conduct an ESD current.

FIG. 16B shows a circuit diagram of an ESD protection circuit (not numbered) the same as the ESD protection circuit 230 shown in FIG. 16A except that, for example, a p-type active device (not numbered) is used to trigger a PMOS (not numbered) and a gate (not numbered) of the p-type active device is coupled to a positive bias source $+V_G$.

Figure 17:
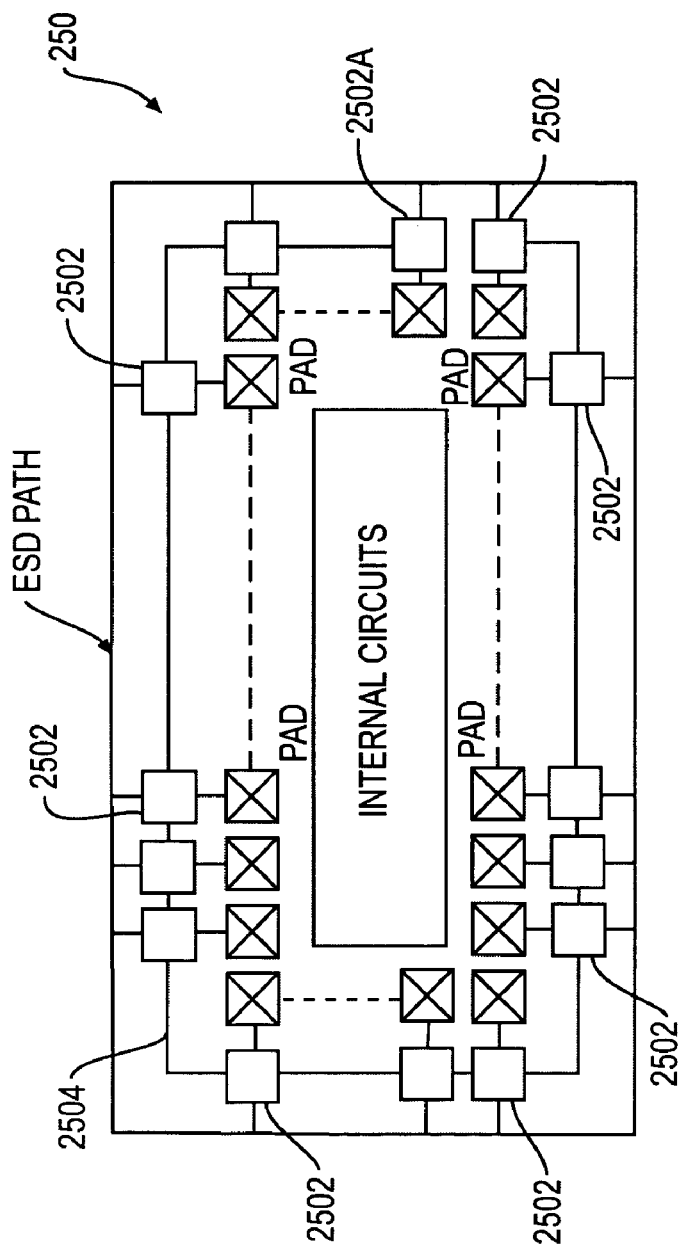
FIG. 17 shows a circuit scheme for ESD protection in accordance with one embodiment of the present invention.

FIGS. 17 to 20 show circuit schemes that employ the ESD protection circuits described in the above embodiments for full-chip ESD protection. Referring to FIG. 17, the circuit scheme 250 includes n-type ESD protection circuits 2502, and a negative bias bus 2504 to which the gates of n-type active devices of the n-type ESD protection circuits 2502 are coupled. A representative n-type ESD protection circuit 2502A includes an n-type active device (not shown) and an ESD protection device, such as an SCR, an FOD, an active device, a BJT or an MOS device, triggered by the n-type active device during an ESD event. Alternatively, the circuit scheme 250 may include p-type ESD protection circuits (not shown) and a positive bias bus to which the gates of p-type active devices of the p-type ESD protection circuits are coupled.

Figure 18:
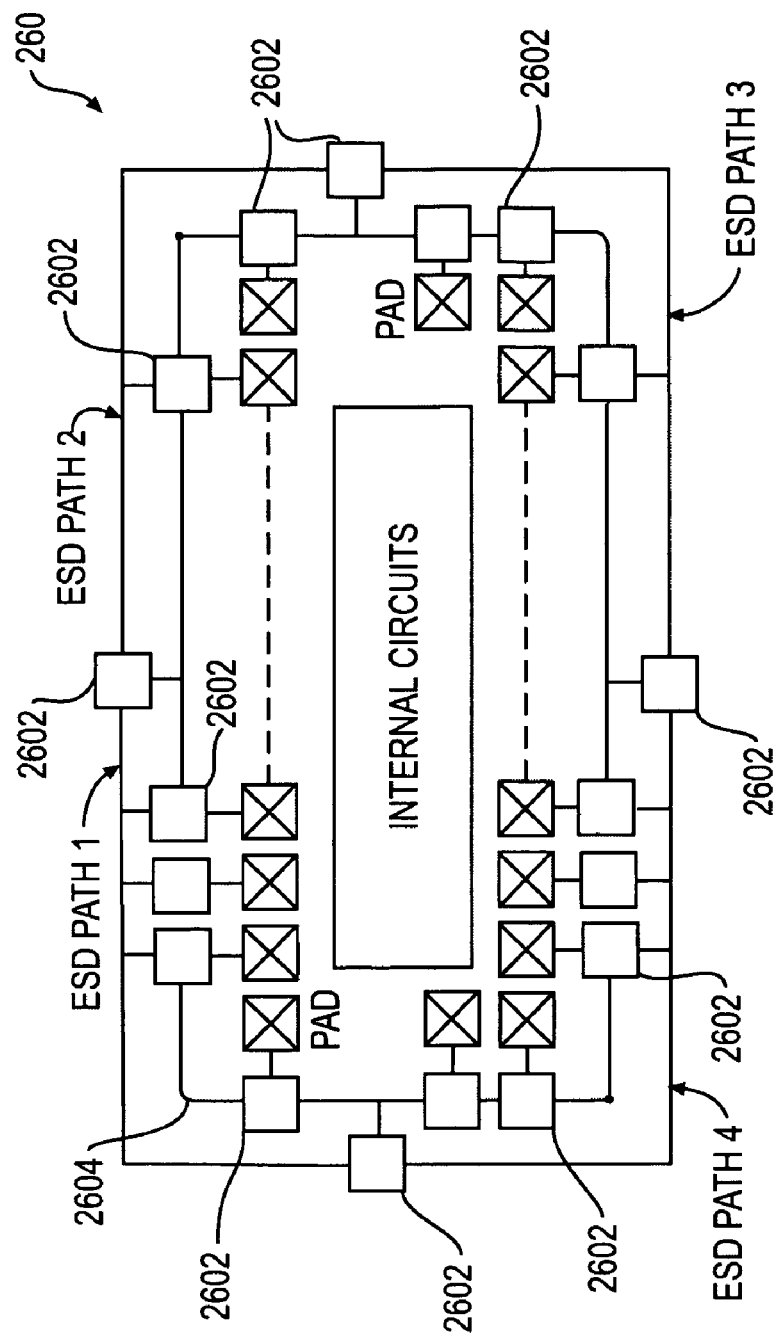
FIG. 18 shows a circuit scheme for ESD protection in accordance with another embodiment of the present invention.

Referring to FIG. 18, a circuit scheme 260 includes ESD protection circuits 2602, a bias bus 2604 to which the gates of active devices of the ESD protection circuits 2602 are coupled, and a plurality of ESD paths, ESD path 1, ESD path 2, ESD path 3 and ESD path 4. FIG. 18 allows ESD pulses to discharge in at least one of the four ESD paths. The ESD protection circuits 2602 are either n-type ESD protection circuits with a negative bias source, or p-type ESD protection circuits with a positive bias source.

Figure 19:
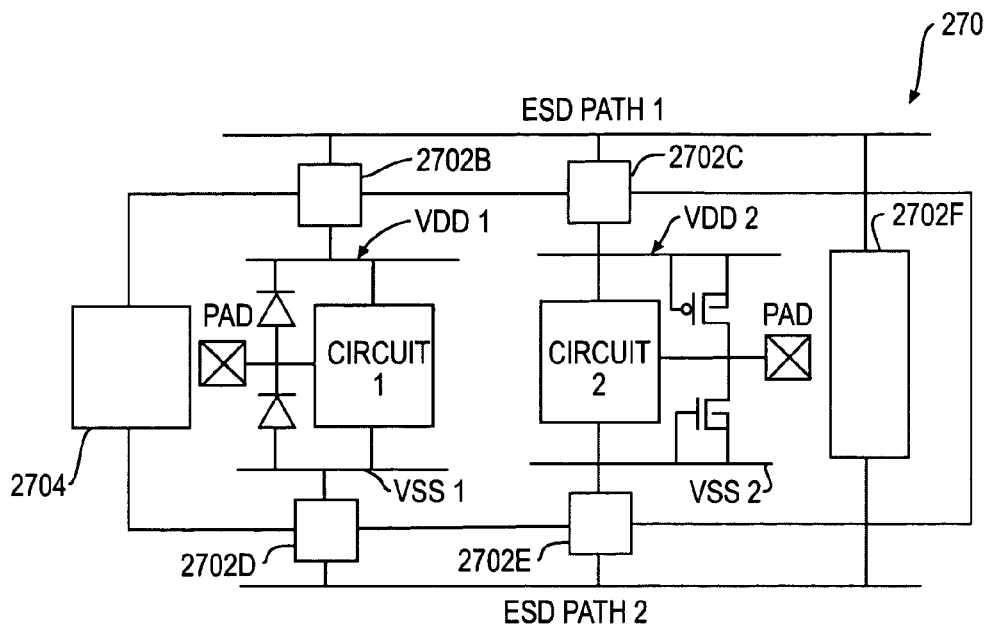
FIG. 19 shows a circuit scheme for ESD protection in accordance with still another embodiment of the present invention.

FIG. 19 shows a multi-power circuit scheme 270 including ESD protection circuits 2702 and a bias circuit 2704 to which the gates of active devices of the ESD protection circuits 2702 are coupled. Referring to FIG. 19, a circuit 1 and a circuit 2 in the multi-power circuit scheme 270 are operating at different voltages, for example in a 3V/5V environment. Representative ESD protection circuits 2702B, 2702C, 2702D, 2702E and 2702F are disposed between ESD path 1 and VDD1, ESD path 1 and VDD2, ESD path 2 and VSS1, ESD path 2 and VSS2, and ESD path 1 and ESD path 2, respectively, for multi-power ESD protection.

Figure 20:
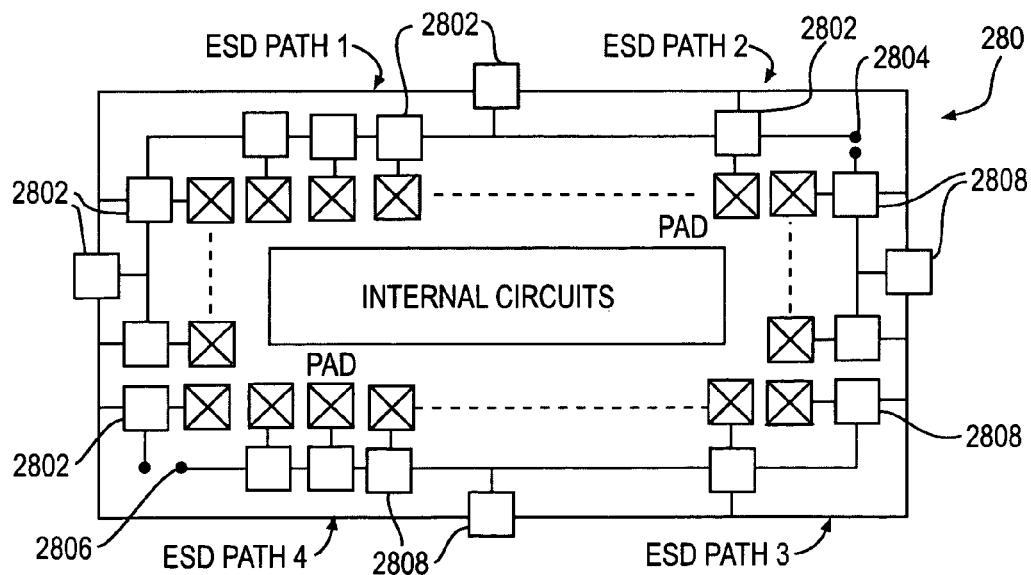
FIG. 20 shows a circuit scheme for ESD protection in accordance with yet another embodiment of the present invention.

FIG. 20 shows a circuit scheme 280 includes n-type ESD protection circuits 2802 coupled to a negative bias bus 2804, and p-type ESD protection circuits 2808 coupled to a positive bias bus 2806. The circuit scheme 280 provides four ESD paths for discharging ESD currents.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge protection circuit, comprising:
   a first terminal;
   a second terminal;
   an electrostatic discharge device coupled between the first and second terminals; and
   an active device coupled to the electrostatic discharge device, the active device to control an electrostatic current through the electrostatic discharge device.

2. The circuit of claim 1, wherein the electrostatic discharge device includes at least one of an SCR, an FOD, an active device, a BJT and an MOS device.

3. The circuit of claim 1, wherein the active device includes an n-type active device or a p-type active device.

4. The circuit of claim 2, wherein the electrostatic discharge device includes an SCR having a base, and wherein the active device includes a first diffused region and a second diffused region, in which one of the diffused regions of the active device is coupled to the base of the SCR.

5. The circuit of claim 4, wherein the SCR includes a first p-type portion coupled to the first terminal, a first n-type region, a second p-type portion, and a second n-type portion coupled to the second terminal.

6. The circuit of claim 5, wherein one of the diffused regions of the active device is coupled to the first p-type portion of the SCR, and the other of the diffused regions is coupled to the second p-type region.

7. The circuit of claim 5, wherein one of the diffused regions of the active device is coupled to the first n-type portion of the SCR, and the other of the diffused regions is coupled to the second n-type portion of the SCR.

8. The circuit of claim 5, wherein one of the diffused regions of the active device is partially formed within the first n-type portion of the SCR, and the other of the diffused regions serves as the second n-type portion of the SCR.

9. The circuit of claim 5, wherein one of the diffused regions of the active device is formed partially within the second p-type portion of the SCR, and the other of the diffused regions serves as the first p-type portion of the SCR.

10. The circuit of claim 2, wherein the active device coupled to the electrostatic discharge device is a first active device, and the electrostatic discharge device includes a second active device having a base, and wherein the first active device has a first diffused region and a second diffused region, in which one of the diffused regions of the first active device is coupled to the base of the second active device.

11. The circuit of claim 10, wherein the second active device includes a first diffused region coupled to the first terminal and a second diffused region coupled to the second terminal, and wherein the other of the diffused regions of the first active device is coupled to the first terminal.

12. The circuit of claim 10, wherein the second active device includes a first diffused region coupled to the first terminal and a second diffused region coupled to the second terminal, and wherein the other of the diffused regions the first active device is coupled to the second terminal.

13. The circuit of claim 2, wherein the electrostatic discharge device includes an FOD having a base, and wherein the active device includes a first diffused region and a second diffused region, in which one of the diffused regions of the active device is coupled to the base of the FOD.

14. The circuit of claim 13, wherein the FOD includes a first diffused region coupled to the first terminal and a second diffused region coupled to the second terminal, and wherein the other of the diffused regions of the active device is coupled to the first terminal.

15. The circuit of claim 13, wherein the FOD includes a first diffused region coupled to the first terminal and a second diffused region coupled to the second terminal, and wherein the other of the diffused regions of the active device is coupled to the second terminal.

16. The circuit of claim 2, wherein the electrostatic discharge device includes a BJT having a base, and wherein the active device includes a first diffused region and a second diffused region, in which one of the diffused regions is coupled to the base of the BJT.

17. The circuit of claim 16, wherein the BJT includes a collector coupled to the first terminal and an emitter coupled to the second terminal, and wherein the other of the diffused regions of the active device is coupled to the first terminal.

18. The circuit of claim 16, wherein the BJT includes a collector coupled to the second terminal and an emitter coupled to the first terminal, and wherein the other of the diffused regions of the active device is coupled to the second terminal.

19. The circuit of claim 2, wherein the electrostatic discharge device includes an MOS device having a base, and wherein the active device includes a first diffused region and a second diffused region, in which one of the diffused regions of the active device is coupled to the base of the MOS device.

20. The circuit of claim 19, wherein the MOS device includes a first diffused region coupled to the first terminal, a second diffused region coupled to the second terminal, and a gate coupled to the second diffused region of the MOS device, and wherein the other of the diffused regions of the active device is coupled to the first terminal.

21. The circuit of claim 19, wherein the MOS device includes a first diffused region coupled to the first terminal, a second diffused region coupled to the second terminal, and a gate coupled to the first diffused region of the MOS device, and wherein the other of the diffused regions of the active device is coupled to the second terminal.

22. The circuit of claim 2, wherein the electrostatic discharge device includes a MOS device and an SCR, in which the SCR has a first p-type portion coupled to the first terminal, a first n-type portion, a second p-type portion, and a second n-type portion coupled to the second terminal, and the MOS has a gate, a first diffused region partially formed in the first n-type portion of the SCR, and a second diffused region which serves as the second n-type portion of the SCR, the active device has a first diffused region and a second diffused region, one the diffused regions of the active device being coupled to the gate of the MOS device.

23. The circuit of claim 22, wherein the active device has a first diffused region and a second diffused region, one the diffused regions of the active device being coupled to the gate of the MOS device.

24. The circuit of claim 22, wherein a resistor is disposed between the gate of the MOS device and the second terminal.

25. The circuit of claim 2, wherein the electrostatic discharge device includes a MOS device and an SCR, in which the SCR has a first p-type portion coupled to the first terminal, a first n-type portion, a second p-type portion, and a second n-type portion coupled to the second terminal, and the MOS has a gate, a first diffused region which serves as the first p-type portion of the SCR, and a second diffused region partially formed in the second n-type portion of the SCR.

26. The circuit of claim 25, wherein the active device has a first diffused region and a second diffused region, one the diffused regions of the active device being coupled to the gate of the MOS device.

27. The circuit of claim 25, wherein a resistor is disposed between the gate of the MOS device and the first terminal.

28. An integrated circuit for electrostatic discharge protection, comprising:
   at least one electrostatic current path; and
   a plurality of electrostatic discharge protection circuits on the current path, each electrostatic discharge protection circuit including
   a first terminal;
   a second terminal;
   an electrostatic discharge device coupled between the first and second terminals; and
   an active device coupled to the electrostatic discharge device, the active device to control an electrostatic current through the electrostatic discharge device.

29. The circuit of claim 28, wherein the electrostatic discharge device includes at least one of an SCR, an FOD, an active device, a BJT and an MOS device.

30. The circuit of claim 28, wherein the active device includes an n-type active device or a p-type active device.

31. The circuit of claim 28, wherein the electrostatic discharge protection circuit is disposed between a first electrostatic current path and a second electrostatic current path.

32. The circuit of claim 28, wherein the electrostatic discharge protection circuit is disposed between an electrostatic current path and a voltage line providing a first voltage.

33. The circuit of claim 32, wherein the electrostatic discharge protection circuit is disposed between an electrostatic current path and a voltage line providing a second voltage different from the first voltage.

34. A method for electrostatic discharge protection circuit, comprising:
   turning on an active device to allow an electrostatic discharge current to flow through an electrostatic discharge device.

35. The method of claim 34, wherein the electrostatic discharge device includes at least one of an SCR, an FOD, an active device, a BJT and an MOS device.

* * * * *

UNITED STATES PATENT AND TRADEMARK OFFICE
CERTIFICATE OF CORRECTION

PATENT NO. : 7,092,227 B2
APPLICATION NO. : 10/230287
DATED : August 15, 2006
INVENTOR(S) : Ming-Dou Ker et al.

It is certified that error appears in the above-identified patent and that said Letters Patent is hereby corrected as shown below:

Claim 22, column 12, line 58, "a MOS" should read --an MOS--.

Claim 22, column 12, line 66, "one the" should read --one of the--.

Claim 23, column 13, line 2, "one the" should read --one of the--.

Claim 25, column 13, line 9, "a MOS" should read --an MOS--.

Claim 26, column 13, line 18, "one the" should read --one of the--.

Signed and Sealed this

Nineteenth Day of December, 2006

JON W. DUDAS
*Director of the United States Patent and Trademark Office*